(12) United States Patent
Buchan et al.

(10) Patent No.: US 6,318,177 B2
(45) Date of Patent: *Nov. 20, 2001

(54) MICROMECHANICAL COMPONENT AND METHOD FOR PRODUCING THE MICROMECHANICAL COMPONENT

(75) Inventors: Nicholas Buchan, Aalborg; Michael Fehrenbach, Eningen; Dietrich Schubert, Reutlingen, all of (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/302,225

(22) Filed: Apr. 29, 1999

(30) Foreign Application Priority Data

Apr. 30, 1998 (DE) .............................. 198 19 458

(51) Int. Cl.$^7$ .................................................. G01P 15/125
(52) U.S. Cl. ........................................................ 73/514.32
(58) Field of Search ........................ 73/514.32, 514.18, 73/514.16, 514.01, 514.36, 514.24; 361/250, 283.3, 280

(56) References Cited

U.S. PATENT DOCUMENTS

| | | | | |
|---|---|---|---|---|
| 5,495,761 | * | 3/1996 | Diem et al. | 73/514.32 |
| 5,563,343 | * | 10/1996 | Shaw et al. | 73/514.24 |
| 5,744,719 | * | 4/1998 | Werner | 73/514.32 |
| 5,756,901 | * | 5/1998 | Kurle et al. | 73/514.32 |
| 5,880,369 | * | 3/1999 | Samuels et al. | 73/512.32 |
| 5,987,989 | * | 11/1999 | Yamamoto et al. | 73/514.32 |
| 6,151,966 | * | 11/2000 | Sakai et al. | 73/514.32 |

* cited by examiner

*Primary Examiner*—Helen Kwok
(74) *Attorney, Agent, or Firm*—Kenyon & Kenyon

(57) ABSTRACT

A method for producing a micromechanical component (e.g., a capacitive acceleration sensor) having one or several electrical or mechanical function variables dependent on at least one geometric design parameter. The micromechanical component is produced by an etching process via which a structure with bars and trenches is formed. The structure is formed by drafting a design for the micromechanical component in such a way that the geometric design parameter within the local area of the micromechanical component is subject to a predetermined process-related regularity. The design parameter is essentially constant in relation to function blocks in particular, so that in the etching process, the process tolerance of the design parameter within the micromechanical component essentially shows no locus dependency.

18 Claims, 4 Drawing Sheets

MICROMECHANICAL COMPONENT AND METHOD FOR PRODUCING THE MICROMECHANICAL COMPONENT

FIELD OF THE INVENTION

The present invention relates to a micromechanical component and to a method for producing the micromechanical component (e.g., a capacitive acceleration sensor) having one or several electrical or mechanical function variables dependent on at least one geometric design parameter. The micromechanical component is produced by an etching process via which a structure with bars and trenches is formed.

BACKGROUND INFORMATION

Using processes of surface micromachining technology, it is possible to produce sensors, actuators and other miniaturized components according to methods that are known from a production of microelectronic components.

It is known that such processes used in surface micromachining technology for producing mechanical and/or electrical functional elements are subject to production process tolerances. In this manner, the term production tolerance is intended to designate the deviation from a setpoint which is expediently selected as the process mean value. As a rule, these production process tolerances result in high variations in the characteristic data of the mechanical or electrical functional elements in question, which must be provided for by balancing, compensation or calibration.

Examples for this are the sensitivity and the resonance frequency of the mentioned micromechanical capacitive acceleration sensor as a function of the trench etching process. In this trench etching process, the sensor is subdivided into a structure having trenches and bars, which contains the necessary functional elements, in this case, capacitor devices and spring devices.

Such production process tolerances, or process tolerances in short, are known to arise in trench etching (e.g., dry etching) due to varying process temperatures or process gas compositions or process gas flow rates, etc.

In general, it is desirable to produce micromechanical components with low characteristic data variation in order to avoid time-consuming and costly calibration processes, balancing processes or the like.

Consequently, one of the objects of the present invention is to keep the characteristic data variations as a function of process tolerances at a low level or to reduce them by a suitable arrangement of certain geometric design parameters.

SUMMARY OF THE INVENTION

A method according to the present invention for producing a micromechanical component, and the micromechanical component have an advantage that, in a specified process tolerance range, a dependency of the characteristic data on the present process situation in the process tolerance range (e.g., 3σ range) is minimized; thus a compensation of the influences occurs simultaneously.

For example, this compensation brings about an increase of the wafer and product yield, a uniform reliability with low balancing outlay (expenses for evaluation electronics are reduced) as well as a smaller possible size of the component.

The present invention provides that the drafting of a design for the micromechanical component proceeds in such a way that the geometric design parameter within the local area of the micromechanical component is subject to a predetermined process-related regularity, the design parameter being essentially constant in relation to function blocks in particular, so that in the etching process, the process tolerance of the design parameter within the micromechanical component shows essentially no locus dependency.

According to another embodiment of the present invention, a determination of an essential dependency of at least one of the electrical or mechanical function variables of the component on the process tolerance of the design parameter or design parameters in question takes place in the etching process. Then, a relationship for the design parameter or design parameters is derived in order to minimize the dependency and finally, the design parameter is determined in such a way that the derived relationship is fulfilled with the expected process tolerance. This procedure is expedient when several design parameters exert a substantial influence and therefore cannot be selected independent of one another.

According to another embodiment of the present invention, the micromechanical component is a capacitive acceleration sensor having a seismic mass device suspended on a torsion spring device, a movable capacitor plate device attached to the seismic mass device and a fixed capacitor plate device interacts with the movable capacitor plate device. In this embodiment, the function variable is the sensitivity of the acceleration sensor, the essential dependency being stated by the following equation:

$$S = C \cdot \frac{(b_m - \Delta)}{(b_f - \Delta)^3 \cdot (d + \Delta)}$$

where C is a constant, $\Delta$ is a process tolerance, $b_m$ is a width of the seismic mass device, $b_f$ is a width of the torsion springs of the torsion spring device, and d is a plate distance of the particular capacitor plate device in the unaccelerated state.

According to another embodiment of the present invention, the relationship is formed by forming the derivation of the dependency according to the process tolerance. This may occur either numerically or, if possible, analytically.

According to an additional embodiment, the regularity is specified in such a way that the etching density is held within certain limits of a specified value.

DETAILED DESCRIPTION

Although the present invention is applicable to any number of micromechanical components, the present invention will be explained below with reference to a micromechanical capacitive acceleration sensor.

Figures 1A, 1B:
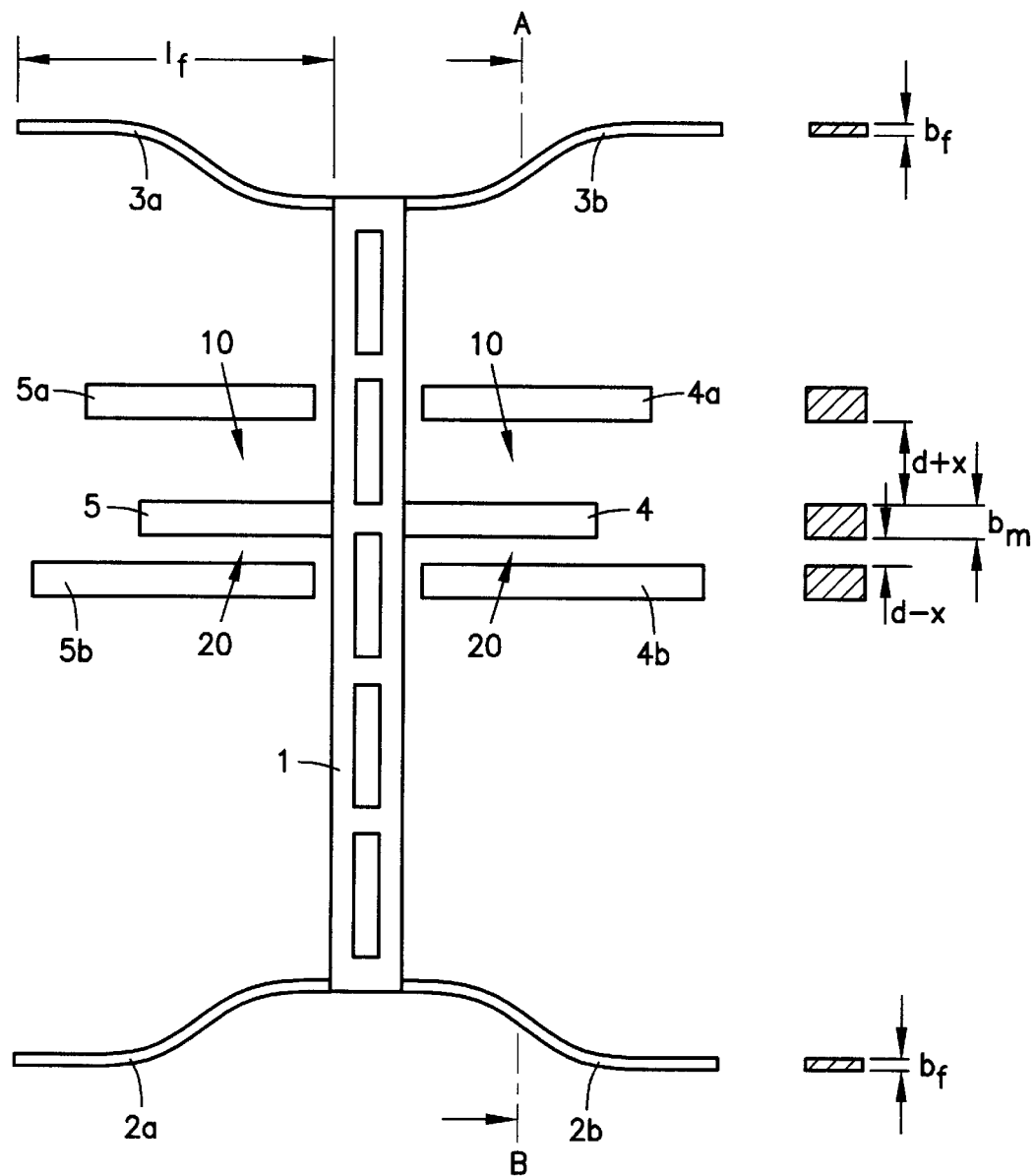
FIG. 1a shows a top view of a schematic representation of a micromechanical capacitive acceleration sensor.
FIG. 1b shows a schematic representation of the micromechanical capacitive acceleration sensor illustrated in FIG. 1a in a cross-section along line A–B.

FIG. 1a shows a schematic representation of a micromechanical capacitive acceleration sensor to explain the present invention and the set of problems on which it is based.

FIGS. 1a and 1b show a seismic mass device 1, a first torsion spring 2a having a width $b_f$ and a length $l_f$, a second torsion spring 2b having a width $b_f$ and a length $l_f$, a third torsion spring 3a having a width $b_f$ and a length $l_f$, a fourth torsion spring 3b having a width $b_f$ and a length $l_f$, a first movable capacitor plate 4 having a width $b_m$, a first fixed capacitor plate 4a, a second fixed capacitor plate 4b, a second movable capacitor plate 5 having a width $b_m$, a third fixed capacitor plate 5a, and a fourth fixed capacitor plate 5b.

Together with first movable capacitor plate 4 and second movable capacitor plate 5, first fixed capacitor plate 4a and third fixed capacitor plate 5a form a first plate capacitor device 10.

Together with first movable capacitor plate 4 and second movable capacitor plate 5, second fixed capacitor plate 4b and fourth fixed capacitor plate 5b form a second plate capacitor device 20.

FIG. 1b shows a schematic representation of the micromechanical capacitive acceleration sensor illustrated in FIG. 1a in cross-section along the line A–B. The deflection of seismic mass device 1 from the center position corresponding to the unaccelerated state is identified as x and the plate distance of the two capacitor devices 10, 20 in the unaccelerated state is identified as d.

The physical relationships on which the analysis of this micromechanical capacitive acceleration sensor is based will be explained in greater detail below.

Voltage output signal VOUt at the time of a deflection x from the equilibrium position can be described as follows:

$$V_{out} = \frac{(C1 - C2)}{(C1 + C2)} \cdot V_{ref} \quad (1)$$

C1 being the capacitance of first plate capacitor device 10, C2 being the capacitance of second plate capacitor device 20 and $V_{ref}$ being a reference voltage applied from the outside to plate capacitor devices 10, 20.
Furthermore:

$$\frac{(C1 - C2)}{(C1 + C2)} = \frac{m \cdot a}{k \cdot d} \quad (2)$$

m identifying the seismic mass of seismic mass device 1, a identifying the instantaneous acceleration occurring at the time of measurement and k identifying the flexural strength of torsion springs 2a, 2b, 3a, 3b.

The following relationship applies to seismic mass m:

$$m = \rho \cdot h \cdot l_m \cdot (b_m - \Delta) \quad (3)$$

$\rho$ identifying the specific weight of the material used (polysilicon in this case), h identifying the layer thickness, $l_m$ identifying the length of seismic mass device 1, and $\Delta$ identifying the present process tolerance.

The following relationship applies to flexural strength k:

$$k = \frac{N \cdot E_{si} \cdot h \cdot (b_f - \Delta)^3}{l_f^3} \quad (4)$$

N identifying the number of bending elements, and $E_{si}$ the modulus of elasticity of the material used (polysilicon in this case).

If equations (3) and (4) are inserted into equation (2) and the thus obtained equation (2) is inserted into equation (1), the following is obtained:

$$V_{out} = \frac{l_f^3 \cdot \rho \cdot h \cdot l_m \cdot (b_m - \Delta) \cdot a \cdot V_{ref}}{N \cdot E_{si} \cdot h \cdot (b_f - \Delta)^3 \cdot (d + \Delta)} \quad (5)$$

In this connection, the etching process under consideration influences the structure defined by the masking method. The plate distance of plate capacitor devices 10, 20 in the equilibrium position increases by the assumed present process tolerance $\Delta$, and width $b_m$ of seismic mass device 1 and widths $b_f$ of torsion springs 2a, 2b, 3a, 3b decrease accordingly.

Combining the variables which are not subject to fluctuations or only relatively insignificant ones into a constant C results in the following:

$$V_{out} = C \cdot \frac{(b_m - \Delta) \cdot a}{(b_f - \Delta)^3 \cdot (d + \Delta)} \quad (6)$$

The electrical function variable of the acceleration sensor that is of primary interest is its sensitivity S which is precisely the derivation of the output voltage with regard to the instantaneous acceleration a to be recorded; thus $$S = C \cdot \frac{(b_m - \Delta)}{(b_f - \Delta)^3 \cdot (d + \Delta)} \quad (7)$$

It is possible to select variables $b_m$, $b_f$ and d of such a size that the relative influence of the process tolerance is reduced. However, this may result in an unfavorable characteristic data field of the sensor, specifically due to the reduction of the capacitance of capacitor devices 10, 20 and the associated reduction of the sensitivity.

From equation (7), variables $b_m$, $b_f$ and d should not be freely selected in a design intended to satisfy the set requirement for reduction or suppression of the influence of process tolerances but rather should fulfill a certain relationship.

In particular, the derivation of equation (7) according to process tolerance A should be equal to zero; thus $dS/d\Delta=0$. In the case described above, this results in the relationship for variables $b_m$, $b_f$ and d for the creation of a design satisfying the set requirement for reduction or suppression of the influence of process tolerances.

Moreover, care must be taken that the process tolerance is locally constant within the local area of an individual component on a wafer, i.e., it does not show any locus dependency, since otherwise the above assumptions no longer apply. This can be assured by compliance with certain layout rules which will be explained in greater detail below.

In the etching process, the design should ensure that the material removed by etching from the structural elements is essentially equal. This is primarily achieved by keeping the specified etching density, i.e., the desired amount of material removed by etching per unit of surface area, within certain limits of a specified value.

Figure 2:
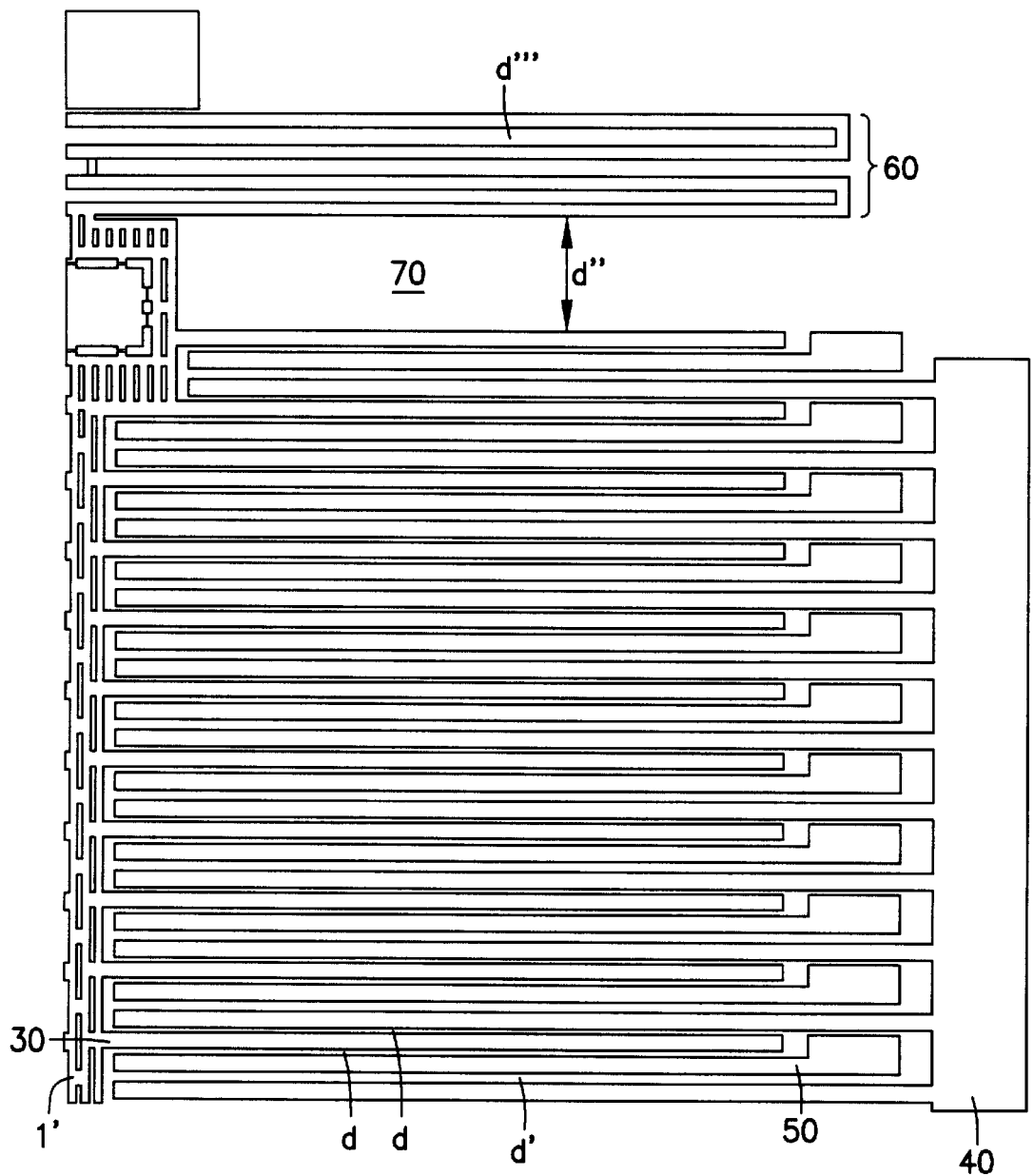
FIG. 2 shows a schematic representation of a structure of the micromechanical capacitive acceleration sensor which is not produced by a method according to the present invention.

FIG. 2 shows a schematic representation of the structure of a micromechanical capacitive acceleration sensor which is not produced of the method according to the present invention.

In particular, FIG. 2 shows a seismic mass device 1' with movable capacitor plates 30, a first comb structure 40 with corresponding first fixed capacitor plates, a second comb structure 50 with corresponding second fixed capacitor plates, a torsion spring device 60, and a wide trench structure 70. The mode of operation of this sensor according to FIG. 2 is analogous to that of the sensor according to FIG. 1a. Various trench widths of the etching trenches are identified as d, d', d", d'".

The following values are selected independent of each other for the variables $b_m$, $b_f$ and d:

$b_f$=3.0 μm $b_m$=5.0 μm d=2.0 μm

Furthermore, constant C from equation (6) is $0.333*10^{-18}$ V/g and the sensor is designed for a sensitivity of 35 g with a surface area of 0.5 mm².

The above-described design does not meet the requirement for low variation of the sensitivity of the sensor and caused great fluctuations of characteristic data in sensitivity.

This is due to the fact that the critical trench widths and bar widths of the essential functional elements and the intermediate and/or marginal areas of the sensor are not matched. In particular, in this design, there are different trench widths d, d'in the area of capacitor plate structure 30, 40, 50; a large trench width d" in area 70 and an additional trench width d'" in the area of torsion spring device 60.

Figure 3:
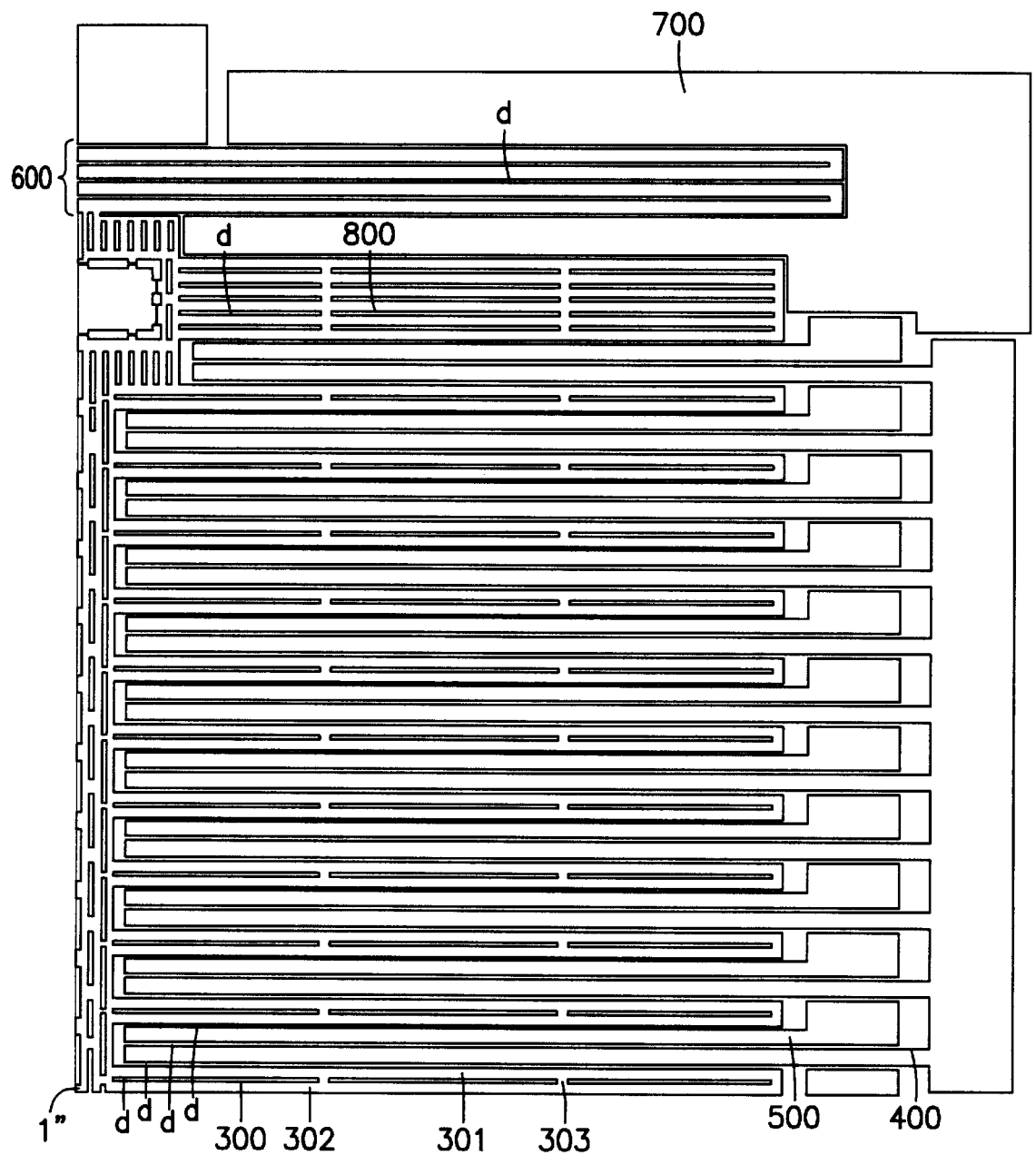
FIG. 3 shows a schematic representation of the structure of the micromechanical capacitive acceleration sensor which is produced by the method according to the present invention.

FIG. 3 shows a schematic representation of the structure of a micromechanical capacitive acceleration sensor which is produced by the method according to the present invention.

In particular, FIG. 3 shows a seismic mass device 1", movable capacitor plates 300 with a dual-arm structure 301, 302 with cross bars 303, a first comb structure 400 with corresponding first fixed capacitor plates, a second comb structure 500 with corresponding second fixed capacitor plates, a torsion spring device 600, a fill area 700, and an added structural area 800 with trenches.

The mode of operation of this sensor shown in FIG. 3 is also analogous to that of the sensor illustrated in FIG. 1a.

In contrast to the sensor shown in FIG. 2, it was ensured for the sensor design illustrated in FIG. 3 provides that the design parameter $b_m$, $b_f$, d within the local area of the micromechanical component is formed essentially uniformly in relation to function blocks. In other words, trench width d is essentially equal in the capacitor devices, between the capacitor devices and in torsion spring device 600. Fill area 700 and added structural area 800 with trenches were provided in addition in order to obtain the locally constant process tolerance Δ. The greater trench width at the edge of the capacitor devices is preferable to avoid interfering edge effects. It does not have an interfering effect, since the fluctuations in length do not exert a substantial influence on the sensitivity.

These design measures of the present invention bring it about that with the trench etching process, the process tolerance Δ, i.e., the bar width or the trench width within the sensor, essentially shows no locus dependency.

The following values are selected independent of each other in particular for the variables $b_m$, $b_f$ and d:

$b_f$=4.0 μm $b_m$=2*3.0 μm (dual-arm structure)

d=2.0 μm

Furthermore, constant C from equation (6) was $1.175*10^{-18}$ V/g and the sensor is likewise designed for a sensitivity of 35 g with a surface area of 0.5 mm².

For the selection of these variables, the derivation of the sensitivity dS/dΔ for the expected process tolerance is set to equal zero. Then, d was set as the minimum design measure. $b_m$ is specified according to an experience value and $b_f$ is calculated from the determined relationship for dS/dΔ=0.

This design meets the requirement for less variation of the sensitivity of the sensor.

Figure 4:
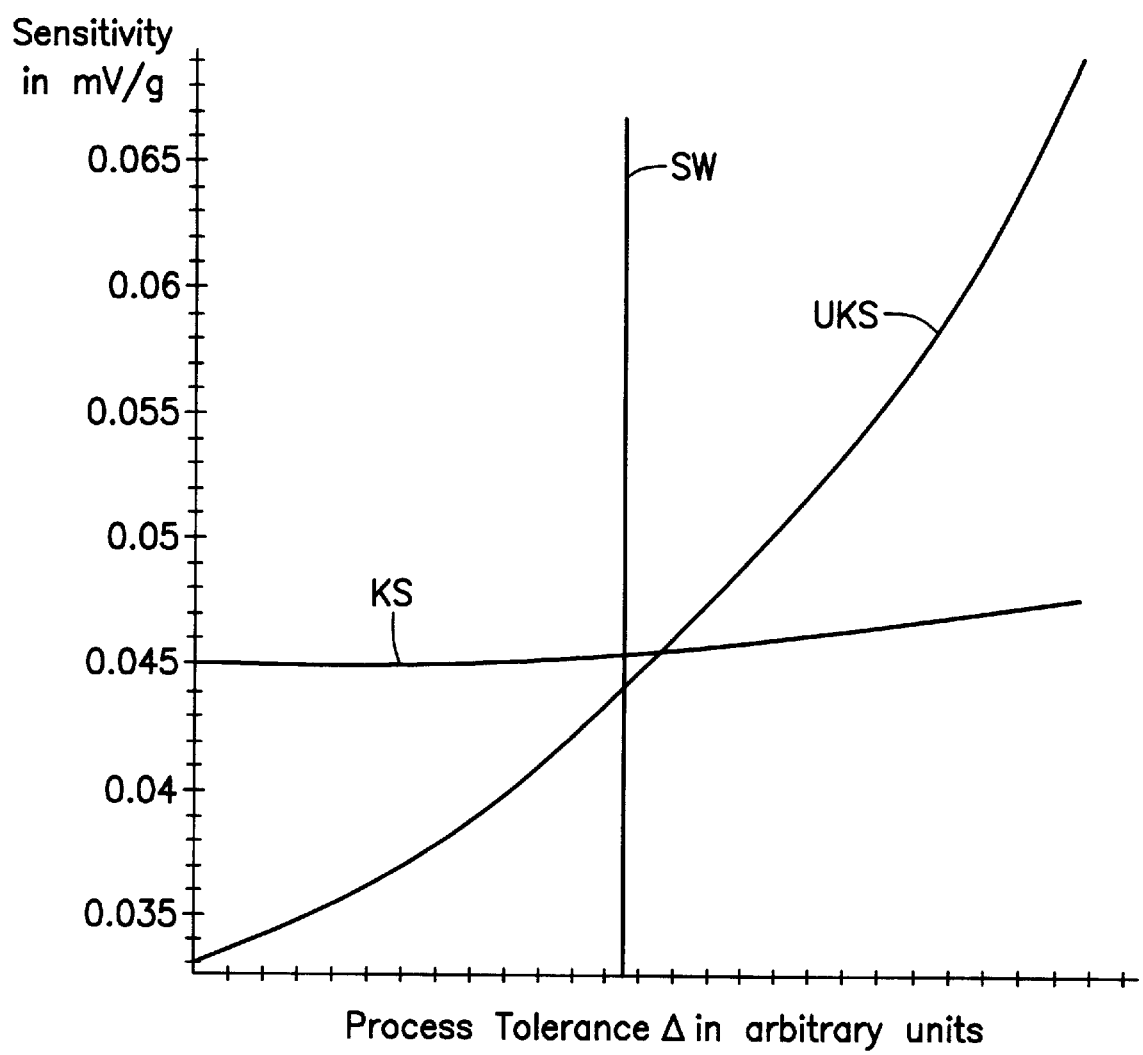
FIG. 4 shows a graphical representation of a sensitivity of the sensors illustrated in FIGS. 2 and 3 as a function of a process tolerance.

FIG. 4 shows a representation of the sensitivity of the sensors illustrated in FIGS. 2 and 3 as a function of the process tolerance.

As shown in FIG. 4, the process tolerance is indicated in arbitrary units on the x axis and the sensitivity is indicated on the y axis in mV/g. Line SW identifies the process setpoint. The result for the uncompensated sensor shown in FIG. 2 is reproduced by curve UKS and the result for the compensated sensor shown in FIG. 3 is reproduced by curve KS.

FIG. 4 illustrated that a curve KS shows no dependency on the process tolerance while a curve UKS shows a drastic dependency on the process tolerance.

With special reference to a capacitive acceleration sensor made of polycrystalline silicon produced by surface micromachining as shown in FIGS. 1, 2 or 3, for example, the following may apply. Seismic mass device 1, 1' or 1" and the movable capacitor plate device 4, 5 or 30 or 300 attached thereto are composed of bars as electrodes which have a process-specific value range for the bar width $b_m$.

The bars of the movable capacitor plate device 4, 5 or 30 or 300 which are attached to the seismic mass device 1, 1' or 1" have a process-specific value range for distance d to the solid electrodes of fixed capacitor plate device 40, 400 or 50, 500.

The distance of the fixed electrodes corresponds to the distance of the bars from which seismic mass device 1, 1' or 1" and movable capacitor plate device 4, 5 or 30 or 300 attached thereto are made up.

Finally, the width of torsion springs bf is set in a possible range of values specific to the process.

The trench process for structuring the elements from polycrystalline silicon causes the bars and springs to be narrower and the distance of the electrodes to be greater.

The values for this loss of structure have a process-related range of variation, e.g., 0.7+/−0.5 μm.

In order to suppress the influence of variation of this loss of structure on the variation of the sensitivity, the ratio $b_m$/bf=0.5 to 0.9 should be maintained for the ranges of design values that are of practical interest, thus 2.0 μm≦$b_m$≦4.0 μm 1.5 μm≦d≦3.0 μm 3.0 μm≦$b_f$≦6.0 μm irrespective of the desired absolute value for sensitivity.

If the range of values is limited to 2.5 μm≦$b_m$≦3.5 μm 1.5 μm≦d≦2.5 μm 3.9 μm≦$b_f$≦5.1 μm the ratio $b_m$/$b_f$=0.6 to 0.8 must be maintained irrespective of the desired absolute value for sensitivity.

In order to obtain a sufficiently high mechanical stability of the electrodes, it is advantageous to design the electrodes in the form of two connected bars due to the limitations of electrode width $b_m$ (FIG. 3).

| | | | | | | Influence of $b_m$ | |
|---|---|---|---|---|---|---|---|
| d | 1.5 | 1.5 | 1.5 | 1.5 | 1.5 | | |
| $b_m$ | 2.0 | 2.5 | 3.0 | 3.5 | 4.0 | MAX-MIN | |
| $b_f$ | 3.10 | 3.61 | 4.01 | 4.29 | 4.55 | $b_f$ | 1.45 |
| $b_m/b_f$ | 0.69 | 0.69 | 0.75 | .82 | 0.88 | $b_m/b_f$ | 0.23 |
| d | 2.0 | 2.0 | 2.0 | 2.0 | 2.0 | | |
| $b_m$ | 2.0 | 2.5 | 3.0 | 3.5 | 4.0 | MAX-MIN | |
| $b_f$ | 3.29 | 3.87 | 4.35 | 4.73 | 4.93 | $b_f$ | 1.64 |
| $b_m/b_f$ | 0.61 | 0.65 | 0.69 | 0.74 | 0.81 | $b_m/b_f$ | 0.20 |
| d | 2.5 | 2.5 | 2.5 | 2.5 | 2.5 | | |
| $b_m$ | 2.0 | 2.5 | 3.0 | 3.5 | 4.0 | MAX-MIN | |
| $b_f$ | 3.42 | 4.09 | 4.60 | 5.06 | 5.40 | $b_f$ | 1.98 |
| $b_m/b_f$ | 0.58 | 0.61 | 0.65 | 0.69 | 0.74 | $b_m/b_f$ | 0.16 |
| d | 3.0 | 3.0 | 3.0 | 3.0 | 3.0 | | |
| $b_m$ | 2.0 | 2.5 | 3.0 | 3.5 | 4.0 | MAX-MIN | |
| $b_f$ | 3.54 | 4.26 | 4.85 | 5.35 | 5.78 | $b_f$ | 2.24 |
| $b_m b_f$ | 0.56 | 0.59 | 0.62 | 0.65 | 0.69 | $b_m/b_f$ | 0.13 |
| Influence of d | | | | | | | |
| MAX-MIN bf | 0.44 | 0.65 | 0.84 | 1.06 | 1.23 | | |
| MAX-MIN $b_m/b_f$ | 0.08 | 0.11 | 0.13 | 0.16 | 0.19 | | |

The above table shows exemplary values for bar distance d, bar width $b_m$, torsion spring width $b_f$ and the influence of bar distance and bar width.

Although the present invention was described above using a preferred exemplary embodiment, it is not limited to this embodiment but rather can be modified in various ways.

In particular, the method of the present invention is not limited to capacitive acceleration sensors and can also be generalized to any micromechanical components.

What is claimed is:

1. A micromechanical component having at least one function variable, comprising:
   a structure having bars and trenches, the bars provided in an alternating manner with respect to the trenches, the structure being formed by an etching procedure,
   wherein a first width of the bars and a second width of the trenches are maintained substantially uniform according to a predetermined grid pattern which extends across the micromechanical component, the structure including elements which have a functionally larger overall width and which are at least partially structured according to the predetermined grid pattern,
   wherein the at least one function variable is one of an electrical function variable and a mechanical function variable, and
   wherein the a t least on e function variable depends from at least one geometric design parameter.

2. The micromechanical component according to claim 1, wherein the micromechanical component is a capacitive acceleration sensor.

3. A method for producing a micromechanical component, comprising:
   drafting a design of the micromechanical component having a first geometric design parameter and a second geometric design parameter;
   etching a work piece to form the micromechanical component, the micromechanical component including a particular structure having bars and trenches, wherein during the etching, the first geometric design parameter and the second geometric design parameter being formed with a process tolerance, the micromechanical component having at least one function variable, the at least one function variable including one of an electrical function variable and a mechanical function variable, the at least one function variable being dependent on the at least first design parameter and the second design parameter;
   determining a dependency of the at least one function variable on the process tolerance of the first geometric design parameter and the second geometric design parameter;
   deriving a relationship between the first design parameter and the second design parameter to minimize the dependency of the function variable; and
   determining the first design parameter and the second design parameter so that the relationship is fulfilled with respect to the process tolerance.

4. The method according to claim 3,
   wherein the micromechanical component is a capacitive acceleration sensor which has:
      a seismic mass device suspended on a torsion spring device,
      a movable capacitor plate device attached to the seismic mass device, and
      a fixed capacitor plate device cooperating with the movable capacitor plate device, and
   wherein the at least one function variable corresponds to a sensitivity of the capacitive acceleration sensor, the at least one function variable being defined as:

$$S = C \cdot \frac{(b_m - \Delta)}{(b_f - \Delta)^3 \cdot (d + \Delta)}$$

wherein:
      C is a predetermined constant,
      $\Delta$ is the process tolerance,
      $b_m$ is a width of the seismic mass device,
      $b_f$ is a width of torsion springs of the torsion spring device, and
      d is a plate distance of at least one of the movable and fixed capacitor plate devices in an unaccelerated state.

5. The method according to claim 3, wherein the relationship is derived by determining the dependency as a function of the process tolerance.

6. The method according to claim 3, further comprising the step of:
   providing the predetermined process-related regularity to maintain an etching density within predetermined limits.

7. The method according to claim 3, wherein the micromechanical component is a capacitive acceleration sensor.

8. The method according to claim 3, wherein at least one of the first geometric design parameter and the second geometric design parameter is substantially constant with respect to function blocks of the at least one function variable.

9. A micromechanical component, comprising:
   a first geometric parameter and a second geometric parameter;
   a structure having bars and trenches, the structure being formed by an etching process, wherein during the etching, the first geometric design parameter and the second geometric design parameter are formed with a process tolerance; and at least one function variable, the at least one function variable including one of an electrical function variable and a mechanical function variable, the at least one function variable being dependent on the first design parameter and the second design parameter, the first design parameter and the second design parameter being set to minimize the dependency of the at least one function variable with respect to the process tolerance.

10. The micromechanical component according to claim 9, wherein the micromechanical component is a capacitive acceleration sensor, the capacitive acceleration sensor including:

a seismic mass device suspended on a torsion spring device, a movable capacitor plate device attached to the seismic mass device, and a fixed capacitor plate device cooperating with the movable capacitor plate device.

11. The micromechanical component according to claim 9, further comprising:

a functional element, wherein the at least one geometric design parameter includes at least one of a bar width of the functional element and a trench width of the functional element.

12. The micromechanical component according to claim 10, wherein the movable capacitor plate device includes capacitor plates which have a dual-arm structure.

13. The micromechanical component according to claim 9, wherein the micromechanical component is a capacitive acceleration sensor.

14. The micromechanical component according to claim 9, wherein at least one of the first geometric design parameter and the second geometric design parameter is substantially constant with respect to function blocks of the at least one function variable.

15. A capacitive acceleration sensor composed of polycrystalline silicon and produced by a surface micromachining procedure, comprising:

a spring device having springs;

a seismic mass device suspended on the spring device;

a movable capacitor place device attached to the seismic mass device; and a fixed capacitor place device cooperating with the movable capacitor plate device, wherein the seismic mass device and the movable capacitor place device include bars having a first process-specific value range for a first width of the bars, wherein a second width of the springs is within a second process-specific value range, and wherein a ratio of the first width and the second width is between 0.5 and 0.9.

16. A capacitive acceleration sensor composed of polycrystalline silicon and produced by a surface micromachining procedure, comprising:

a spring device having springs;

a seismic mass device suspended on the spring device;

a movable capacitor plate device attached to the seismic mass device; and a fixed capacitor plate device cooperating with the movable capacitor plate device, wherein the movable capacitor plate device is made in the form of two connected bars which have a first specific value process range for a first width of the connected bars, and wherein a second width of the springs is within a second process-specific value range.

17. A capacitive acceleration sensor produced by a micromachining procedure, comprising:

a spring device having springs;

a seismic mass device suspended on the spring device;

a movable capacitor plate device attached to the seismic mass device; and a fixed capacitor plate device cooperating with the movable capacitor plate device, wherein the movable capacitor plate device is made in the form of two connected bars which have a first process specific value range for a first width of the connected bars and a second width of the springs is within a second process specific value range.

18. A capacitive acceleration sensor produced by a micromachining procedure, comprising:

a spring device having springs;

a seismic mass device suspended on the spring device;

a movable capacitor plate device attached to the seismic mass device; and a fixed capacitor plate device cooperating with the movable capacitor plate device, wherein the movable capacitor plate device has a first and a second arm which are connected by cross-bars, wherein a first width of the first and second arm has a first process specific value range and a second width of the springs is within a second process specific value range.

* * * * *